(12) United States Patent
Van Dommelen

(10) Patent No.: US 11,852,696 B2
(45) Date of Patent: Dec. 26, 2023

(54) MAGNETIC SENSOR ASSEMBLY

(71) Applicant: Sencio B.V., Nijmegen (NL)

(72) Inventor: Ignatius Josephus Van Dommelen, Nijmegen (NL)

(73) Assignee: Sencio B.V., Nijmegen (NL)

( * ) Notice: Subject to any disclaimer, the term of this patent is extended or adjusted under 35 U.S.C. 154(b) by 0 days.

(21) Appl. No.: 17/798,094

(22) PCT Filed: Feb. 11, 2021

(86) PCT No.: PCT/NL2021/050089
§ 371 (c)(1),
(2) Date: Aug. 8, 2022

(87) PCT Pub. No.: WO2021/162550
PCT Pub. Date: Aug. 19, 2021

(65) Prior Publication Data
US 2023/0092411 A1     Mar. 23, 2023

(30) Foreign Application Priority Data
Feb. 13, 2020   (NL) ...................................... 2024891

(51) Int. Cl.
*G01R 33/00*       (2006.01)

(52) U.S. Cl.
CPC ................................ *G01R 33/0047* (2013.01)

(58) Field of Classification Search
CPC .......................... G01R 33/0047; G01R 33/0206
USPC ........................................................ 324/244
See application file for complete search history.

(56) References Cited

U.S. PATENT DOCUMENTS

| | | | |
|---|---|---|---|
| 2007/0170228 A1* | 7/2007 | Zhao | ..................... B81B 7/0074 228/102 |
| 2013/0249029 A1 | 9/2013 | Vig et al. | |
| 2013/0277836 A1* | 10/2013 | Jensen | ..................... H01L 24/24 257/737 |
| 2014/0320124 A1 | 10/2014 | David et al. | |
| 2017/0148757 A1* | 5/2017 | Nishiyama | ......... G01R 33/0206 |

FOREIGN PATENT DOCUMENTS

| | | | |
|---|---|---|---|
| EP | 1811566 A2 | | 7/2007 |
| JP | H088474 A | | 1/1996 |
| JP | 2000215428 A | * | 8/2000 |
| JP | 2000215428 A | | 8/2000 |
| JP | 2005123478 A | | 5/2005 |
| JP | 2009229296 A | | 10/2009 |

* cited by examiner

*Primary Examiner* — Christopher P McAndrew
(74) *Attorney, Agent, or Firm* — N.V. Nederlandsch Octrooibureau

(57) ABSTRACT

Magnetic sensor assembly (1) having a magnetic sensor (2) with a main sensor surface (2a) and four side surfaces (2b), and a lead frame (3) having a main lead frame surface (3a). The magnetic sensor (2) is positioned onto the lead frame (3) with one of the four side surfaces (2b), and the main sensor surface (2a) is oriented perpendicular to the main lead frame surface (3a). The magnetic sensor (2) has a first plurality of contact pads (4), the lead frame (3) a second plurality of external bond pads (5). The first plurality of contact pads (4) are connected to a subgroup of the second plurality of external bond pads (5) by a conductive glue (6).

8 Claims, 3 Drawing Sheets

MAGNETIC SENSOR ASSEMBLY

FIELD OF THE INVENTION

Figure 1:
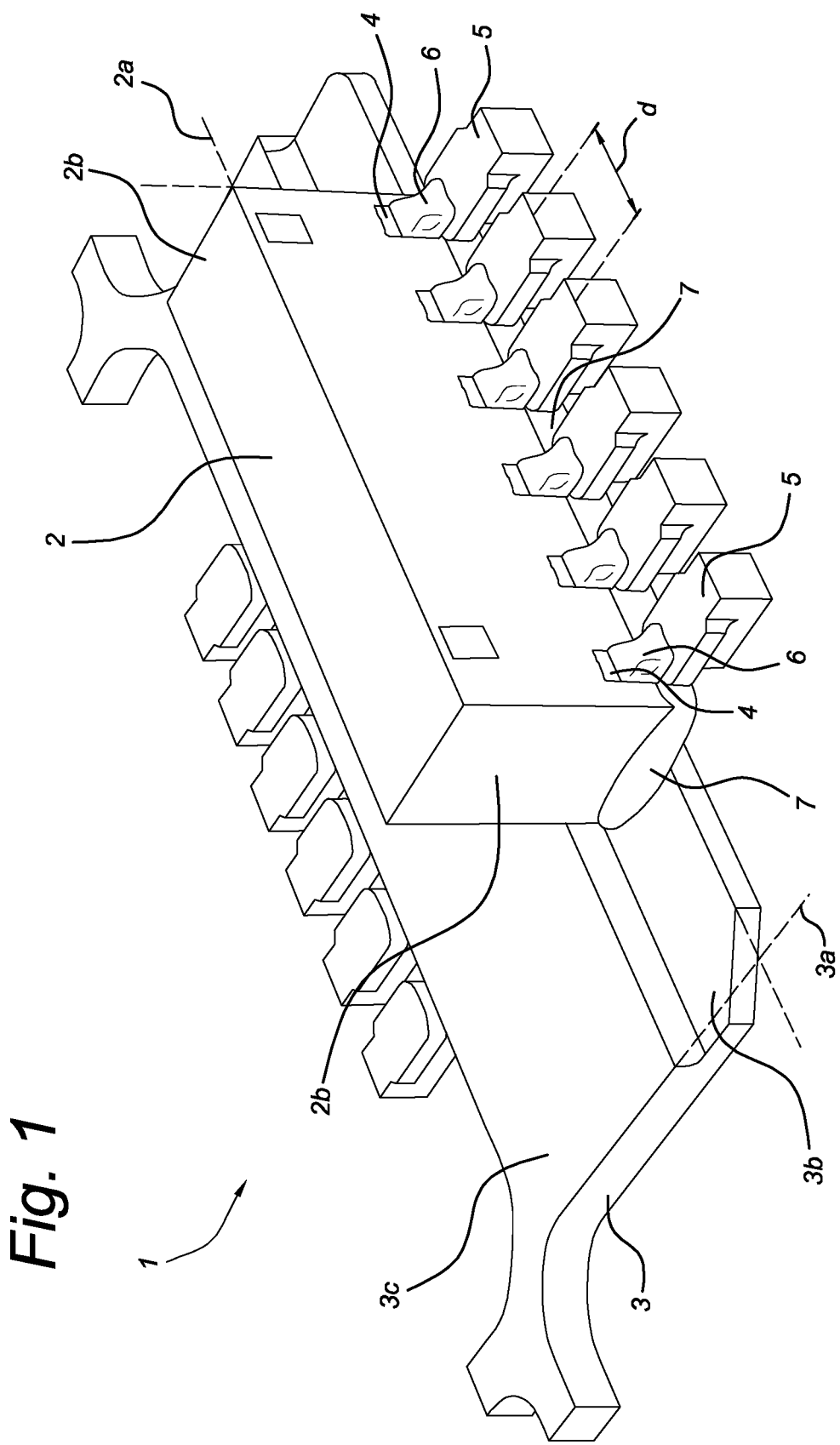

The present invention relates to a magnetic sensor assembly comprising a magnetic sensor with a main sensor surface and four side surfaces, and a lead frame having a main lead frame surface.

BACKGROUND ART

US patent publication US2004/0103530 discloses a magnetic sensor and lead frame therefor known from the prior art, having magnetic sensors arranged on a surface of a board. One (first) sensor is sensitive to components of an external magnetic field in two directions, which are orthogonal to each other on the surface of the board. The other (second) sensor is sensitive to components of an external magnetic field in one direction, which is orthogonal to the surface of the board, and orthogonal to the two directions of the first sensor. The second sensor is positioned upright on the board's surface. The embodiments described in this publication are provided with at least two magnetic sensors of which a main surface is tilted relative to a surface of the board, and relative to each other.

American patent publication US2013/277836 discloses sensor(s) or electronic device(s) using vertical mounting with interconnections. A die member is disclosed with a first surface region perpendicular to the substrate member. The first surface region comprises (magnetic) sensors in contact with contact regions, which may be connected to the contact regions of the substrate using a conductive material e.g. a conductive adhesive. The contact regions may comprise bond pads.

American patent publication US2017/148757 discloses a semiconductor device that can electrically connect a semiconductor element. A sensor element has a reference surface mounted perpendicular to the main surface and connected to an element pad that is connected to the substrate pads of the substrate with a conductive bonding member.

Japanese patent publication JP2005-123478 discloses a miniaturized magneto-electric conversion device. The hall element sensor 6 disclosed does not have a side surface mounted on the main surface of the lead frame. Further, the hall element sensor is connected to the lead frame via a bonding wire and a conductive resin comprising e.g. solder.

SUMMARY OF THE INVENTION

The present invention seeks to provide a magnetic sensor assembly providing an improved sensitivity, and which is easy to assemble and manufacture.

According to the present invention, a magnetic sensor assembly as defined above is provided, wherein the magnetic sensor is positioned onto the lead frame with one of the four side surfaces, and the main sensor surface is oriented perpendicular to the main lead frame surface, wherein a magnetic sensor assembly is moulded at least in part around the magnetic sensor and lead frame and forming a package body thereof, wherein the magnetic sensor comprises a first plurality of contact pads, the lead frame comprises a second plurality of external bond pads, the first plurality of contact pads are connected to a subgroup of the second plurality of external bond pads by a conductive glue, and wherein the second plurality of external bond pads are extending away from the package body. The mutual orientation of the magnetic sensor and lead frame allow for an improved sensitivity of the magnetic sensor assembly, and the structure thereof is easy to assemble.

SHORT DESCRIPTION OF DRAWINGS

Figure 2:
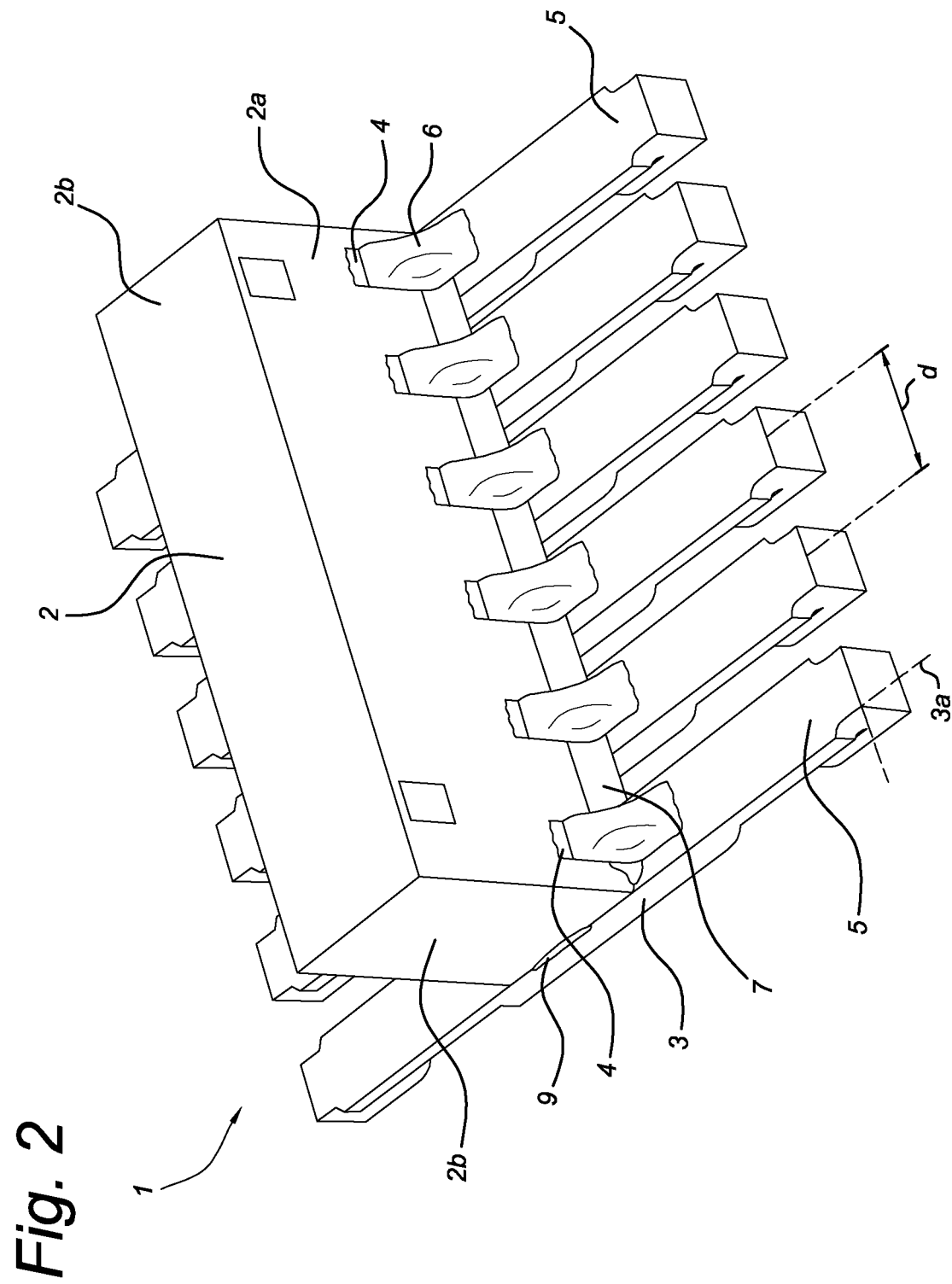
Figure 3:
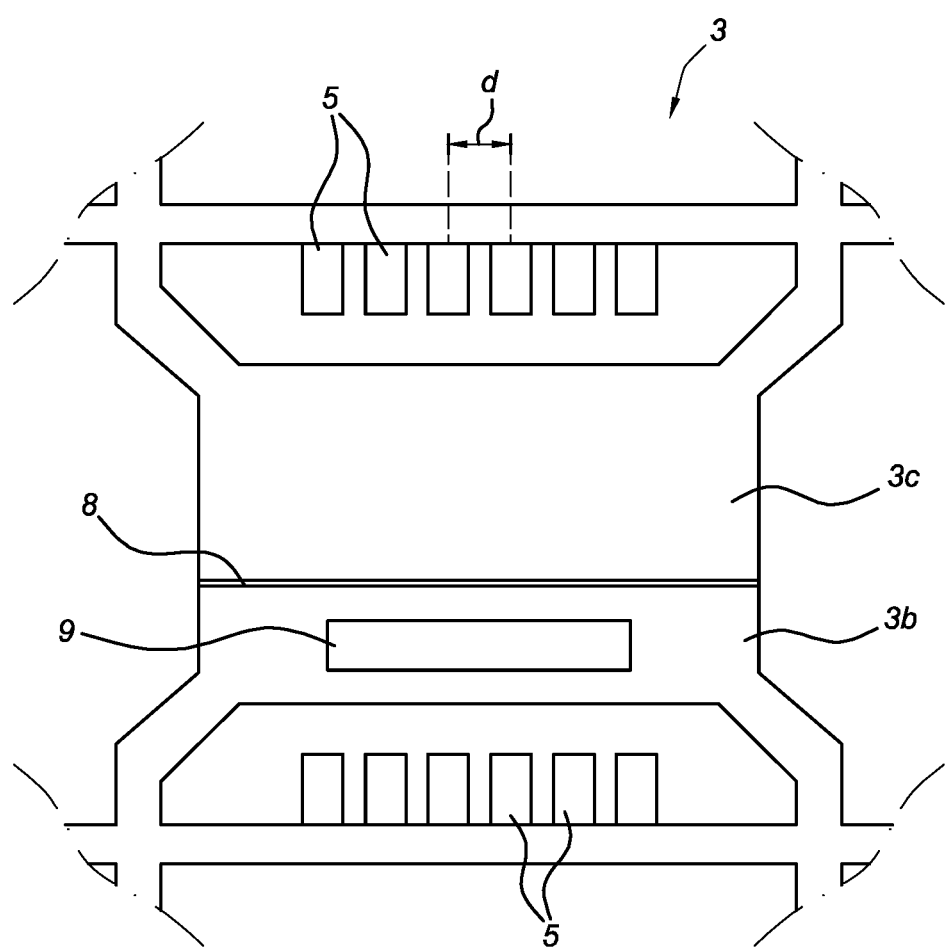

The present invention will be discussed in more detail below, with reference to the attached drawings, in which FIG. 1 shows a perspective view of a magnetic sensor assembly according to an embodiment of the present invention;

FIG. 2 shows a perspective view of a magnetic sensor assembly according to a further embodiment of the present invention; and FIG. 3 shows a top view of a lead frame as used in a magnetic sensor assembly according to an even further embodiment of the present invention.

DESCRIPTION OF EMBODIMENTS

For many applications, packaged integrated circuits are needed which include a magnetic sensor. Depending on the application the magnetic sensor can be sensitive for detecting magnetic fields in one or more (orthogonal) directions.

The present invention embodiments provide a solution for obtaining a magnetic sensor assembly having a higher sensitivity than prior art solutions.

FIG. 1 shows a perspective view of a magnetic sensor assembly 1 according to an embodiment of the present invention. The magnetic sensor assembly 1 comprises a magnetic sensor 2 with a main sensor surface 2a (at its front and back side) and four side surfaces 2b. The magnetic sensor 2 comprises the actual magnetic sensor element in a packaging material, having a first plurality of contact pads 4 in contact with the magnetic sensor element. In the embodiment of FIG. 1, a part of a lead frame 3 is shown having a main lead frame surface 3a (i.e. the major flat plane of the lead frame 3), and a second plurality of external bond pads 5. After moulding a package around the assembly of lead frame 3 and magnetic sensor 2, the lead frame 3 can be cut and the plurality of external bond pad 5 are extending from the moulded package. In the embodiment shown in FIG. 1, the magnetic sensor 2 is positioned onto the lead frame 3 with one of the four side surfaces 2b, and the main sensor surface 2a is oriented perpendicular to the main lead frame surface 3a. Furthermore as already mentioned, the magnetic sensor 2 comprises a first plurality of contact pads 4 (e.g. positioned at the main sensor surface 2a), and the lead frame 3 comprises a second plurality of external bond pads 5. The first plurality of contact pads 4 are connected to a subgroup of the second plurality of external bond pads 5 by a conductive glue 6. By having the magnetic sensor 2 positioned on its side (i.e. with one side surface 2b attached to the main lead frame surface 3a), an improved sensitivity can be obtained.

In the embodiment shown in FIG. 1, a non-conducting layer 7 is positioned between the lead frame 3 and the one of the four side surfaces 2b. This ensures that the first plurality of contact pads 4, connected to the subgroup of the second plurality of external bond pads 5, can never be in electrical contact with a further die or other circuitry or component attached to the lead frame 3 (and included in the eventual moulded package).

In a further embodiment, the non-conducting layer 7 comprises a glue material, which is e.g. cured or otherwise hardened after application to the corner space formed by each individual contact pad 4 and associated external bond pad 5.

In the exemplary embodiment shown in FIG. 1 the main lead frame surface 3a is provided with a recessed magnetic sensor attachment area 3b (e.g. etched into the main lead frame surface 3a). The magnetic sensor attachment area 3b provides space for correctly positioning a side surface 2b of the magnetic sensor 2 with respect to the external bond pads 5. During manufacturing, furthermore, the recessed magnetic sensor attachment area 3b allows to properly and easily apply the material eventually forming the non-conducting layer 7.

FIG. 2 shows a perspective view of a magnetic sensor assembly 1 according to a further embodiment of the present invention. In this embodiment, the lead frame 3 as used has a different form than the one used in the FIG. 1 embodiment, but is still provided with a main lead frame surface 3a, onto which a side surface 2b of the magnetic sensor 2 is positioned. In this embodiment, the lead frame surface 3a is provided with a recess 9, which allows to be filled with material eventually resulting in the non-conducting layer 7.

By using a recess 9, positioning of the side surface 2b of the magnetic sensor 2 during assembly is improved (especially when matching the relevant dimensions). The recess 9 is an etched recess in a further embodiment, and alternatively or additionally, the recess 9 is provided by a machining process such as stamping, or milling.

FIG. 3 shows an even further embodiment of the present invention magnetic sensor assembly, wherein the main lead frame surface 3a is provided with an extending rim 8 on the main lead frame surface 3a. The extending rim 8 ensures that when the material eventually forming the non-conducting layer 7 is applied, e.g. in a fluid form, its application is limited to the magnetic sensor attachment area 3b defined by the extending rim 8, and does not run onto a further attachment area 3c (where e.g. the further die or other circuitry or component can be positioned as mentioned above). In the exemplary embodiment shown in FIG. 3, the extending rim 8 is a linear ridge extending over the main lead frame surface 3a. It is noted that such an extending rim 8 can e.g. be applied as a weld line or a fillet on the main lead frame surface 3a (as the lead frame 3 is usually of a metal or metal compound material). In the exemplary embodiment shown in FIG. 3, a similar recess 9 as discussed above with reference to the FIG. 2 embodiment is present, however it is noted that this is an optional element.

In a further embodiment, the first plurality of contact pads 4 and the second plurality of external bond pads 5 have a same pitch distance d. Such a pitch distance d ensures a proper aligning and possibility to provide the conductive glue 6 connections between associated contact pads 4 and external bond pads 5. The pitch distance d is less than 1 mm, e.g. 0.4 mm. This is compatible with existing manufacturing techniques for assembly of packaged integrated circuits. In an even further embodiment, the first plurality of contact pads 4 have a flip-chip configuration, allowing to further enhance the manufacturing process.

The present invention has been described above with reference to a number of exemplary embodiments as shown in the drawings. Modifications and alternative implementations of some parts or elements are possible, and are included in the scope of protection as defined in the appended claims.

The invention claimed is:

1. A magnetic sensor assembly comprising a magnetic sensor with a main sensor surface and four side surfaces, and a lead frame having a main lead frame surface, wherein the main lead frame surface corresponds to a major, flat plane of the lead frame,
    wherein the magnetic sensor is positioned onto the lead frame with one of the four side surfaces attached to the main lead frame surface, and the main sensor surface is oriented perpendicular to the main lead frame surface,
    wherein a magnetic sensor assembly is moulded at least in part around the magnetic sensor and lead frame and forming package body thereof,
    wherein the magnetic sensor comprises a first plurality of contact pads, the lead frame comprises a second plurality of external bond pads, the first plurality of contact pads are connected to a subgroup of the second plurality of external bond pads by a conductive glue,
    wherein the second plurality of external bond pads are extending away from the package body,
    wherein the main lead frame surface comprises a magnetic sensor attachment area providing space for positioning the one of the four side surfaces of the magnetic sensor, and
    further comprising an extending rim on the main lead frame surface defining in part the magnetic attachment area; wherein a non-conductive layer is provided between the magnetic sensor attachment area and the one of the four side surfaces, and wherein the non-conductive layer is delimited by the extending rim.

2. The magnetic sensor assembly according to claim 1, wherein the non-conducting layer comprises a glue material.

3. The magnetic sensor assembly according to claim 1, wherein the main lead frame surface is provided with a recess.

4. The magnetic sensor assembly according to claim 3, wherein the recess is an etched recess.

5. The magnetic sensor assembly according to claim 1, wherein the extending rim is a linear ridge extending over the main lead frame surface.

6. The magnetic sensor assembly according to claim 1, wherein the first plurality of contact pads and the second plurality of external bond pads have a same pitch distance.

7. The magnetic sensor assembly according to claim 6, wherein the pitch distance is less than 1 mm.

8. The magnetic sensor assembly according to claim 1, wherein the first plurality of contact pads have a flip-chip configuration.

* * * * *